United States Patent
Graf et al.

(10) Patent No.: US 7,418,566 B2
(45) Date of Patent: Aug. 26, 2008

(54) MEMORY ARRANGEMENT AND METHOD FOR READING FROM A MEMORY ARRANGEMENT

(75) Inventors: Jens Graf, Gochsheim (DE); Martin Thomas, Kraichtal (DE); Axel Aue, Korntal-Muenchingen (DE)

(73) Assignee: Robert Bosch GmbH, Stuttgart (DE)

( * ) Notice: Subject to any disclaimer, the term of this patent is extended or adjusted under 35 U.S.C. 154(b) by 47 days.

(21) Appl. No.: 10/079,767

(22) Filed: Feb. 19, 2002

(65) Prior Publication Data

US 2002/0144051 A1 Oct. 3, 2002

(30) Foreign Application Priority Data

Feb. 16, 2001 (DE) ................................. 101 07 833

(51) Int. Cl.
*G06F 13/14* (2006.01)
(52) U.S. Cl. ...................... 711/168; 711/167; 711/103; 711/104; 710/52
(58) Field of Classification Search .................. 710/46, 710/48, 52, 53; 711/103, 154, 155, 170
See application file for complete search history.

(56) References Cited

U.S. PATENT DOCUMENTS

| | | | | |
|---|---|---|---|---|
| 6,161,162 A | * | 12/2000 | DeRoo et al. | 710/244 |
| 6,490,666 B1 | * | 12/2002 | Cabrera et al. | 711/161 |
| 6,567,335 B1 | * | 5/2003 | Norman et al. | 365/230.06 |

\* cited by examiner

*Primary Examiner*—Than Nguyen
(74) *Attorney, Agent, or Firm*—Kenyon & Kenyon LLP

(57) ABSTRACT

A memory arrangement is provided, which has a programmable memory and a first buffer memory associated with the programmable memory, to which buffer memory, in the case of a command access, at least one command following the accessed command is written. A second buffer memory may also be provided, to which buffer memory, in the case of a data access, at least one datum following the accessed datum is written. Also provided is a method for reading from a memory arrangement during program execution, wherein presence of a command access or a data access recognized, and a command following the accessed command is written to a first buffer memory and a datum following the accessed datum is written to a second buffer memory. Thus, in this manner, a separate buffer memory is described for data accesses, and thus the content of the buffer for command accesses is not overwritten or destroyed when data accesses occur during the program execution.

8 Claims, 3 Drawing Sheets

MEMORY ARRANGEMENT AND METHOD FOR READING FROM A MEMORY ARRANGEMENT

FIELD OF THE INVENTION

The present invention relates to a memory arrangement having a memory and an associated buffer memory, as well as a method for reading from the memory arrangement.

BACKGROUND OF INVENTION

Modem burst flash memories, which may be located both on the processor as well as external to it, function according to the principle that when an address is created, the contents of all memory cells that are connected to the activated word line are placed on the bit lines. The number of bit lines is substantially greater than would be needed for a command. In the clock pulses following the creation of the address, it is possible to read the data from an intermediate buffer without recreating the address. With this method, the operating performance is reduced in that data accesses between the command accesses change or destroy the buffer contents, and consequently the long phase, the creation of the addresses and reading the information to the bit lines is again made necessary.

It is thus evident that the prior art methods are not capable of delivering optimal results in every respect.

SUMMARY OF THE INVENTION

The present invention addresses the above-mentioned limitations of the prior art by providing a memory arrangement having a programmable memory and a first buffer memory assigned to this memory, to which buffer memory, in the case of a command access, at least one command following the accessed command is written. A second buffer memory may also be provided, to which buffer memory, in the case of a data access, at least one datum following the accessed datum is written.

The present invention also provides a method for reading from a memory arrangement, wherein command accesses and data accesses are executed, in particular in connection with a program run. In accordance with the method of the present invention, presence of a command access or a data access recognized, and proceeding therefrom, a command following the accessed command is written to a first buffer memory and a datum following the accessed datum is written to a second buffer memory.

Thus, in accordance with the present invention, a separate buffer memory is described for data accesses, this buffer memory being filled when data are accessed. Consequently, the content of the buffer for command accesses is not overwritten or destroyed when data accesses occur in the program run. Furthermore, the present invention obviates the need to reload the buffer present in the memory after each data access.

In addition, the present invention offers much lower hardware expense since it is not necessary for multiple addressing ranges to be present in different memories, but rather requires only one buffer, and accordingly the content of the intermediate memory for commands are not changed or destroyed. It is thus possible to attain great advantages in burst flash memories, for example.

In an exemplary embodiment of the present invention, a switch is made between the first and the second buffer memories as a function of whether a command access or a data access occurs. This switch may be accomplished by an address matcher that recognizes whether commands or data are accessed, or the information as to whether data or commands are accessed, may be recognized through the corresponding signals of the processor itself, wherein it is possible to use the signals to shift between the two buffer memories.

In a further embodiment, the second buffer memory is loaded only, i.e., exclusively, in the case of data accesses, in order to avoid overwriting or destroying the content of the first buffer memory.

DETAILED DESCRIPTION

Figure 1:
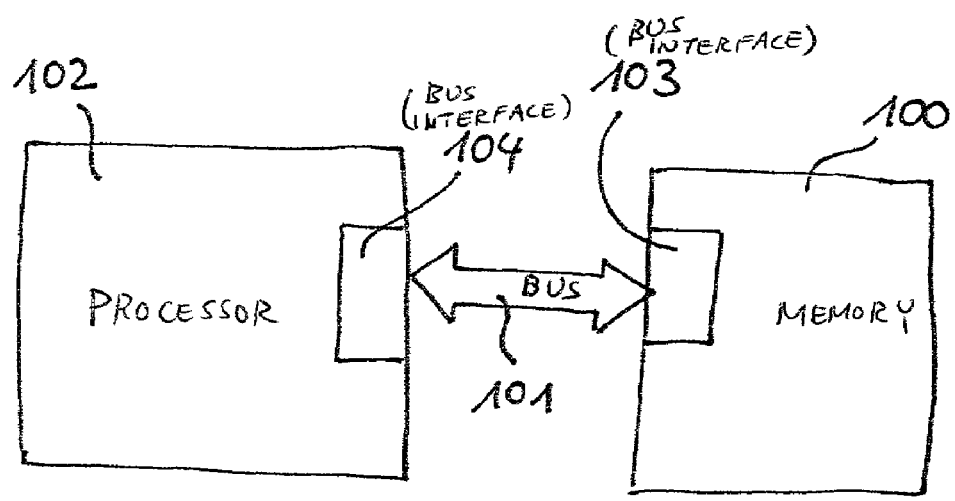
FIG. 1 illustrates an arrangement having a processor and a memory arrangement which are interconnected via a bus system.

FIG. 1 shows an arrangement or a device which is usable for control operations in the automotive industry, for example, such as engine control, transmission control, brake control, steering control, etc. However, the present invention is not limited to applications in the automotive industry, but rather it is generally applicable in many control operations. Sensors and actuators as well as other components not essential to the present invention are not shown in the drawings.

In FIG. 1, a processor is identified as 102, which performs the control functions mentioned above. Via a bus interface 104 and a bus 101, this processor is connected to a memory arrangement 100 and its bus interface 103. The communication of processor 102 with memory arrangement 100 is achieved via bus 101, which facilitates necessary exchange of addresses, data and instructions or commands. Memory arrangement 100 itself may include both volatile and non-volatile memories or buffer memories.

Figure 2:
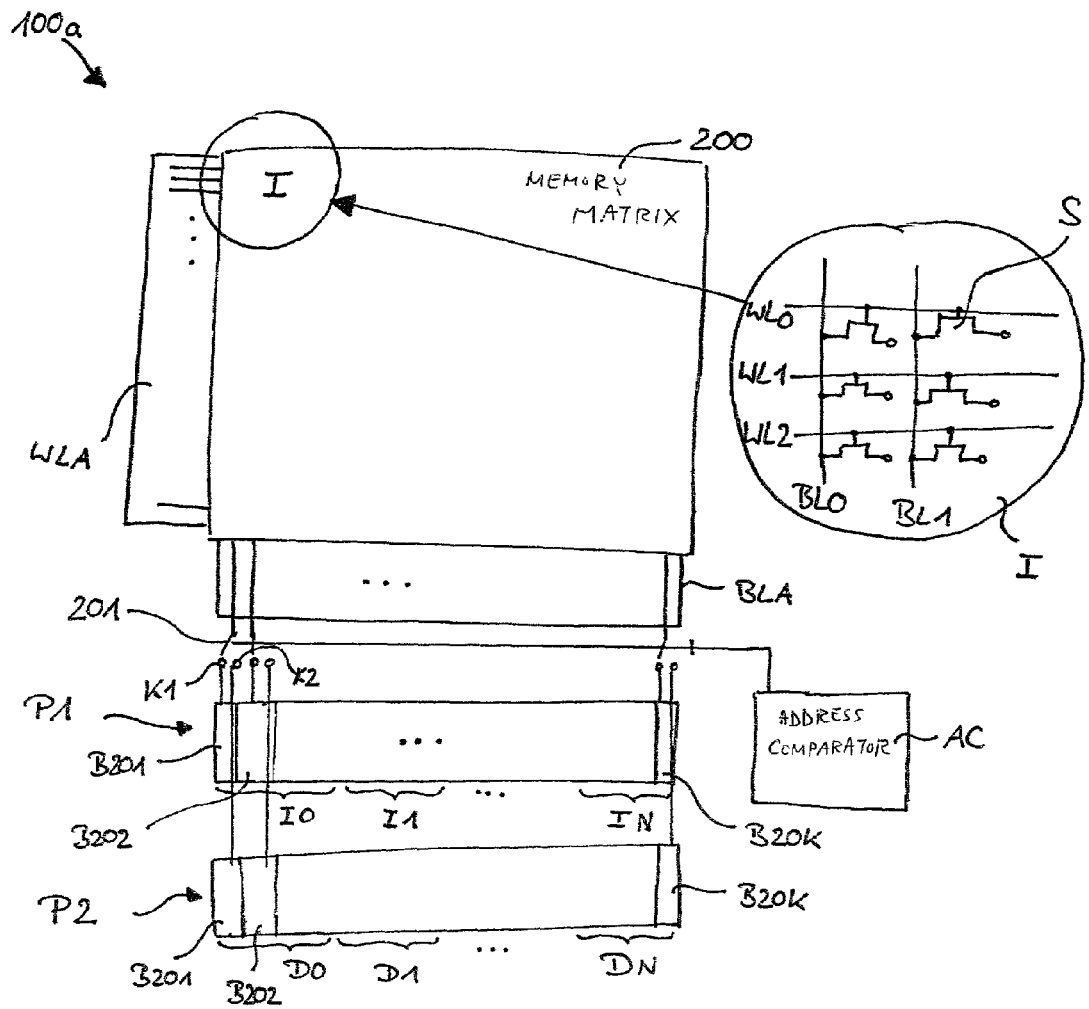
FIG. 2 shows a memory arrangement according to the present invention having buffer memories.

FIG. 2 shows part 100a, which is a portion of memory arrangement 100. Within part 100a is shown a memory matrix identified as 200, the underlying structure of memory matrix 200, the structure of the network of word lines WL and bit lines BL with intermediate switching or transistor elements S being shown by detail I in the form of a detailed section.

In detail I, three word lines WL0, WL1 and WL2, as well as two bit lines BL0 and BL1, with intermediate switching elements S, are shown as an example. In area WLA, the word line address is able to find a connection, as is the corresponding bit line address in area BLA. In the case of an access, addresses are thus created and all bit lines BL are loaded to a word line WL (I).

The two buffer memories shown as P1 and P2 are used for command or data access. The buffers may either be integrated in the memory itself or only be connected to it. Similarly, only one buffer memory may be integrated in the memory itself, while the other one is only connected to the memory.

In the buffer memories, K-bits are shown as B201, B202 to B20K, each of which has a corresponding terminal (K1, K2/) to the corresponding location of bit line address BLA. Using a switching arrangement 201, it is then possible to switch between these terminals or contacts K1 and K2 for the respective bit B of the respective buffer memory P so that the information to be read out is either read into buffer P1 or into buffer P2. Space is provided in buffer memory P1 for instructions, i.e., commands I0 to IN, N (N∈NO) being specifiable as a function of the structure of the memory matrix; correspondingly, locations are provided for data D0 to DN in buffer memory P2.

Dependent on address comparator or address matcher AC which recognizes or differentiates the data or program addresses, the information of the bit lines is stored in buffer P1 in the case of a program code, i.e, a command or command access, or in buffer P2 in the case of data accesses. The definition of this area, i.e., the buffer or buffers, may be made via registers which may be written by the processor, which registers describe the upper and lower limit of the data area. Another possibility is to use a signal from the processor since status pins are present in processors, which signal indicates whether a command access or a data access occurs.

The reading of information from buffer P1 or buffer P2 is then possible for instructions or commands, respectively, as done with the intermediate memory (burst buffer), in particular a burst flash memory, known in the art.

The present invention will be further illustrated using a program example below:

100 1 add R1, R2, R3
104 2 sub R3, R4, R5
106 3 ld R4, 0×0C (R1)-external
100 4 add R6, R7, R8

In the case of command 1, it is recognized that the command is not a data access. Consequently, the word line is activated on the assumption that the address is not present in the buffer. Moreover, the information migrates from memory matrix 200 into buffer P1, and is then transferred from buffer P1 to the computer or processor.

In the case of command 2, it is recognized that it is already located in buffer P1 (burst function), and it may then be output immediately without the necessity of reactivating the word line. In this case, the burst mode or burst function means that, with an address access to a command or a datum, not only the command or datum represented by the address, but also subsequent commands or data, are loaded into the buffer, the number of reloaded commands being a function of burst mode defaults or the size of the memory matrix or buffer memory P1 or P2.

In the case of command 3, as with command 2 and command 1, if it is contained in the burst, it is also recognized that it is already located in buffer P1 and may thus also be output immediately without reactivating the word line, wherein command 3 brings about the reading of a value from the memory in which the commands are also present during execution. The memory now recognizes the data access, for example, by the described address comparator or address matcher AC and reads the data into second buffer P2. In doing so, the data are then read from this second buffer P2.

According to the present invention, command 4 may now, like commands 1, 2 and 3, be processed from buffer P1 since the data access has not changed or destroyed the content of this buffer memory P1, as would be the case with the memories described in the prior art. In accordance with the present invention, it is thus possible in this case to avoid the time-consuming recreation of the address and reading the information (in this case, command 4, for example) to the bit lines.

Address comparator AC itself or the processor simultaneously switches all bit lines from buffer P1 to buffer P2 and in the opposite direction via the status pin or status pins.

In such an exemplary embodiment in which the processor switches the bit lines, it is thus possible to eliminate the address comparator output to the switches for buffers P1 or P2. This output line, which provides the switching signals for the switching elements for the individual buffer, may then be connected directly to the status pins of the processor or processors which have the same information as the address comparator. This means that the output line is set by the processor to a specific level in the case of data accesses, as a result of which they are recognized and a switch is possible.

Figure 3:
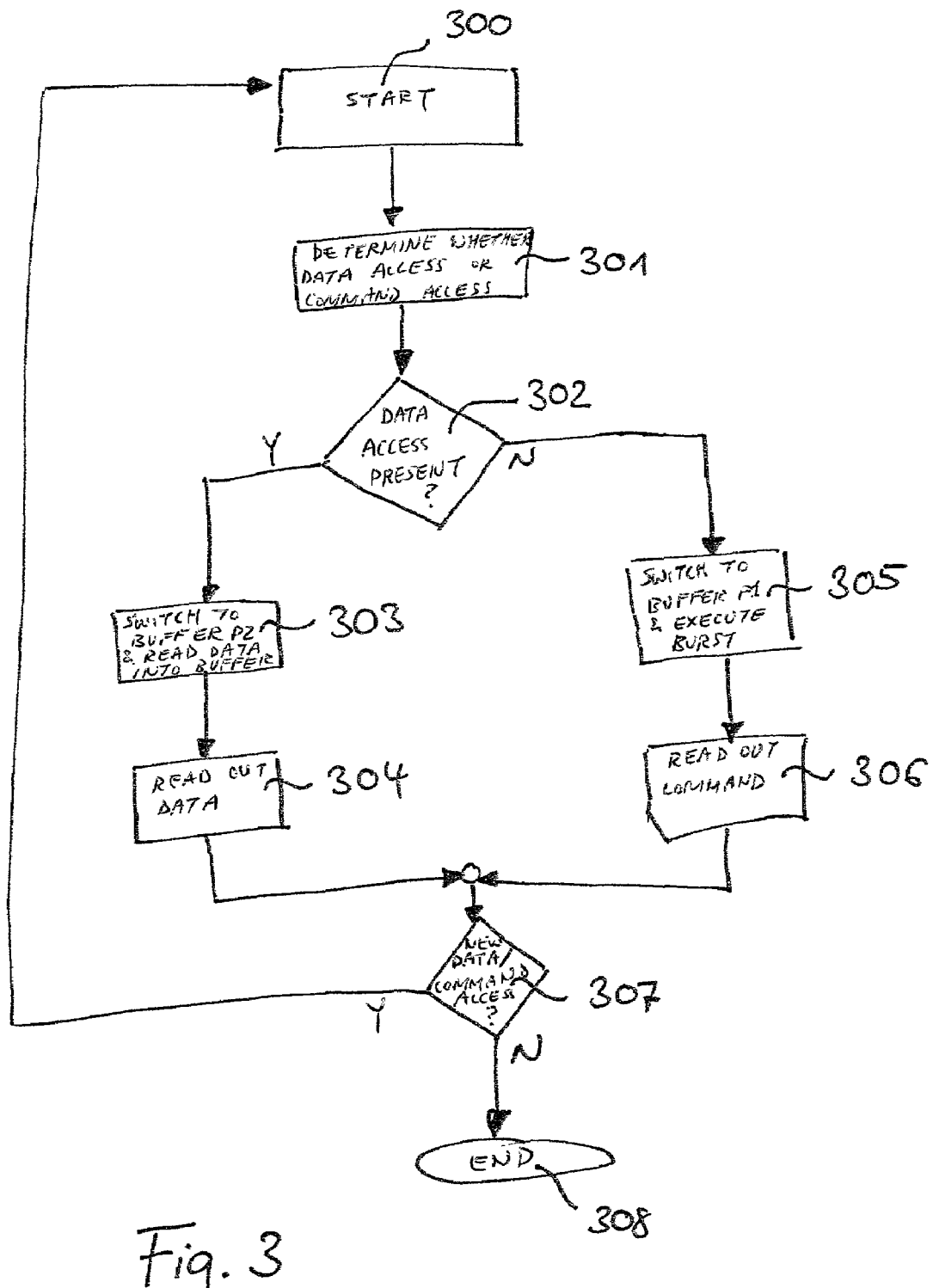
FIG. 3 shows an exemplary flowchart which describes writing and reading of data in connection with the buffer memories.

A flowchart is shown in FIG. 3 for the purpose of illustrating the method according to the present invention. In block 300, the start occurs through a data access or command access. In block 301, it is determined by the methods described above whether it is a data access or command access.

Query 302 is used to check whether a data access or command access is present. If a command access is present and not a data access, a switch is made to buffer memory P1 or a switching position to buffer memory P1 is sustained in block 305 and the burst from the program run is executed. In block 305, it is also possible to check whether or not a new burst is needed.

In block 306, the command or the commands are then read out and query 307 is reached.

If it is recognized in query 302 that it is a case of a data access, the system moves to block 303. There, a switch is made to buffer memory P2 and the datum is or the data are read into the buffer memory.

In block 304, the datum is or the data are read out. After that, the system moves to query 307, in which step it is queried whether a new data access or command access is present. If this is not the case and the end of the program run has been reached, the procedure is completed in block 308. If the program run is not yet completed, a return is made to block 300 for a new data access or command access.

The technology according to the present invention, which provides a memory arrangement and a corresponding method of data access, is particularly advantageous for fast-operating bus interfaces since the random access time to the memory (the flash in particular), i.e., the time between the activation of the word line and reading in the data or commands into the intermediate buffer in the case of non-sequential accesses, is set as a relatively constant quantity, and it is thus possible to attain a great time savings with the present invention.

What is claimed is:

1. A memory arrangement comprising:
a programmable memory;
a first buffer memory associated with the programmable memory, to which first buffer memory, responsive to a request for a program command which is accessed in the programmable memory, a plurality of commands following the accessed command in the programmable memory are written, wherein a first information line associated with the first buffer memory is used for command transfer, and wherein the accessed command and the plurality of commands following the accessed command are simultaneously stored in sequential memory locations of the first buffer memory; and
a second buffer memory to which, responsive to a request for a datum which is accessed in the programmable memory, a plurality of data following the accessed datum in the programmable memory are written, wherein a second information line associated with the second buffer memory is used for data transfer, and wherein the accessed datum and the plurality of data following the accessed datum are simultaneously stored in sequential memory locations of the second buffer memory;
wherein at least one of the first buffer memory and the second buffer memory is one of integrated in the programmable memory and connected to the programmable memory;

wherein the respective ones of the plurality of commands following the accessed command are associated with respective ones of the plurality of data following the accessed datum by corresponding respective sequential positions of the respective ones of the plurality of commands within the first buffer memory and the respective ones of the plurality of data within the second buffer memory; and wherein each of the respective ones of the plurality of data is processed in accordance with the respective datum's associated command.

2. The memory arrangement according to claim 1, wherein the programmable memory includes a burst flash memory.

3. The memory arrangement according to claim 1, wherein the second buffer memory is loaded only in the case of a data access.

4. The memory arrangement according to claim 1, wherein content of the first buffer memory is not changed when the plurality of data is subsequently read from the second buffer memory.

5. A buffering method for performance during a program execution in connection with a programmable memory, comprising the steps of:

recognizing in the case of a request for a program command which is accessed in the programmable memory that a command access is present;

recognizing in the case of a request for a datum which is accessed in the programmable memory that a data access is present;

responsive to the command request, writing a plurality of commands following the accessed command in the programmable memory to a first buffer memory, wherein a first information line associated with the first buffer memory is used for command transfer, and wherein the accessed command and the plurality of commands following the accessed command are simultaneously stored in sequential memory locations of the first buffer memory; and responsive to the datum request, writing a plurality of data following the accessed datum in the programmable memory to a second buffer memory, wherein a second information line associated with the second buffer memory is used for data transfer, and wherein the accessed datum and the plurality of data following the accessed datum are simultaneously stored in sequential memory locations of the second buffer memory;

wherein at least one of the first buffer memory and the second buffer memory is one of integrated in the programmable memory and connected to the programmable memory;

wherein respective ones of the plurality of commands are associated with respective ones of the plurality of data by corresponding respective sequential positions of the respective ones of the plurality of commands within the first buffer memory and the respective ones of the plurality of data within the second buffer memory; and wherein each of the respective ones of the plurality of data is processed in accordance with the respective datum's associated command.

6. The method according to claim 5, further comprising the step of:

shifting access to the programmable memory between the first buffer memory and the second buffer memory as a function of whether the command access or the data access is desired.

7. The method according to claim 6, wherein the step of shifting access is determined by an address matcher that recognizes whether the command access or the data access is desired.

8. The method according to claim 6, wherein the step of shifting access is determined by at least one signal of a processor which indicates whether the command access or the data access is desired.

* * * * *